(12) United States Patent
Nazarian

(10) Patent No.: US 7,149,124 B2
(45) Date of Patent: Dec. 12, 2006

(54) BOOSTED SUBSTRATE/TUB PROGRAMMING FOR FLASH MEMORIES

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 11/018,580

(22) Filed: Dec. 21, 2004

(65) Prior Publication Data

US 2005/0111260 A1 May 26, 2005

Related U.S. Application Data

(62) Division of application No. 10/663,277, filed on Sep. 16, 2003, now Pat. No. 6,977,842.

(51) Int. Cl.
G11C 11/34 (2006.01)
G11C 7/00 (2006.01)

(52) U.S. Cl. ............................ 365/185.27; 365/185.18; 365/203

(58) Field of Classification Search ............ 365/185.27, 365/203, 185.18
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,677,873 A | 10/1997 | Choi et al. | |
| 5,748,529 A | 5/1998 | Lee | |
| 6,049,494 A * | 4/2000 | Sakui et al. | 365/203 |
| 6,487,117 B1 | 11/2002 | Choi et al. | |
| 2003/0137867 A1 | 7/2003 | Salling | |

* cited by examiner

*Primary Examiner*—Son T. Dinh
(74) *Attorney, Agent, or Firm*—Leffert Jay & Polglaze, PA

(57) ABSTRACT

A boosted substrate tub/substrate floating gate memory cell programming process is described that applies a voltage to the substrate or substrate "tub" of a NAND Flash memory array to precharge a channel of carriers within the floating gate memory cells prior to applying a high gate programming voltage to the gate of the selected floating gate memory cells and coupling a program or program-inhibit voltage to program the selected floating gate memory cell(s) as desired. The use of a boosted tub programming approach avoids the requirement that the bitline and/or source line circuit design of the NAND Flash array be able to withstand or carry high voltages during programming of a floating gate memory cells and allows reuse of the block erase high voltage circuits connected to the substrate tub. This allows the NAND Flash memory array to be designed with smaller circuit designs and/or smaller circuit feature elements.

53 Claims, 6 Drawing Sheets

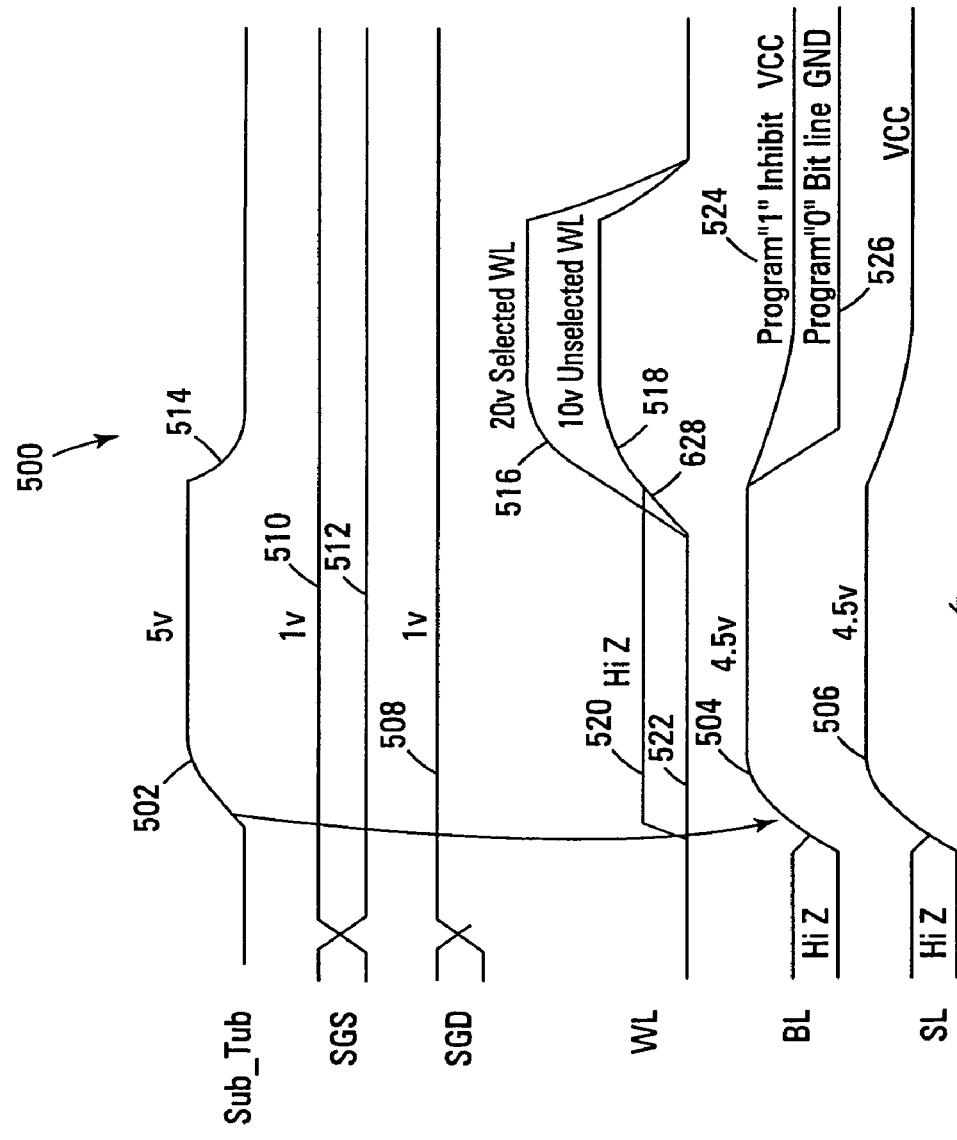

BOOSTED SUBSTRATE/TUB PROGRAMMING FOR FLASH MEMORIES

RELATED APPLICATION

This is a divisional application of U.S. patent application Ser. No. 10/663,277, filed Sep. 16, 2003 now U.S. Pat. No. 6,977,842, titled "BOOSTED SUBSTRATE/TUB PROGRAMMING FOR FLASH MEMORIES", which is commonly assigned, the entire contents of which are incorporated herein by reference

TECHNICAL FIELD OF THE INVENTION

The present invention relates generally to memory devices and in particular the present invention relates to Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A floating gate, typically made of doped polysilicon, is disposed over the channel region and is electrically isolated from the other cell elements by a dielectric material, typically an oxide. For example, gate oxide can be formed between the floating gate and the channel region. A control gate is located over the floating gate and is also typically made of doped polysilicon. The control gate is electrically separated from the floating gate by another dielectric layer. Thus, the floating gate is "floating" in dielectric so that it is insulated from both the channel and the control gate. Charge is transported to or removed from the floating gates by specialized programming and erase operations, respectively. Other types of non-volatile memory include, but are not limited to, Polymer Memory, Ferroelectric Random Access Memory (FeRAM), Ovionics Unified Memory (OUM), and Magnetoresistive Random Access Memory (MRAM).

Yet another type of non-volatile memory is a Flash memory. A typical Flash memory comprises a memory array, which includes a large number of memory cells. Each of the memory cells includes a floating gate embedded in a MOS transistor. The cells are usually grouped into sections called "erase blocks." Each of the cells within an erase block can be electrically programmed selectively by tunneling charges to the floating gate. The negative charge is typically removed from the floating gate by a block erase operation, wherein all floating gate memory cells in the erase block are erased in a single operation.

Two common types of Flash memory array architectures are the "NAND" and "NOR" architectures, so called for the resemblance which the basic memory cell configuration of each architecture has to a basic NAND or NOR gate circuit, respectively. In the NOR array architecture, the floating gate memory cells of the memory array are arranged in a matrix. The gates of each floating gate memory cell of the array matrix are connected by rows to word select lines (word lines) and their drains are connected to column bit lines. The source of each floating gate memory cell is typically connected to a common source line. The NOR architecture floating gate memory array is accessed by a row decoder activating a row of floating gate memory cells by selecting the word line connected to their gates. The row of selected memory cells then place their stored data values on the column bit lines by flowing a differing current if in a programmed state or not programmed state from the connected source line to the connected column bit lines.

A NAND array architecture also arranges its array of floating gate memory cells in a matrix such that the gates of each floating gate memory cell of the array are connected by rows to word lines. However each memory cell is not directly connected to a source line and a column bit line. Instead, the memory cells of the array are arranged together in strings, typically of 8, 16, 32, or more each, where the memory cells in the string are connected together in series, source to drain, between a common source line and a column bit line. The NAND architecture floating gate memory array is then accessed by a row decoder activating a row of floating gate memory cells by selecting the word select line connected to their gates. In addition, the word lines connected to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series connected string, restricted only by the memory cells of each string that are selected to be read. Thereby placing the current encoded stored data values of the row of selected memory cells on the column bit lines.

Two common programming techniques for NAND architecture Flash memories are the "boosted bitline" and the "boosted source line." In these techniques a high voltage is applied to the gate of a selected floating gate transistor of a string, while the remaining transistors are turned on in a pass through mode, from either the connected bitline or from a source line connected to the opposite end of the chain of floating gate transistors.

A problem with programming NAND architecture Flash memories is that programming typically involves applying a high voltage to elements of the memory array; usually the bitline or the source line and/or their associated elements, depending on whether "boosted bitline" or "boosted source line" programming is used. This can require the usage of larger feature circuit elements or differing circuit designs in these portions of the memory array to be able to withstand the higher programming voltages. The use of larger featured circuit elements and/or more complex designs can cause design issues and/or force the manufacturer to utilize a larger integrated circuit chip die, increasing manufacturing costs and reducing the final integrated circuit chip die yield for a given process and process substrate wafer size, further increasing costs. Additionally, small variations in the circuit elements of the bitlines, source lines, and/or their associated circuit elements can lead to variations in the programming voltages applied to the individual floating gate memory cells. This can lead to problems with over/under programming and/or write fatigue of the selected memory cells and an increased likelihood of disturb problems in the unselected memory cells of the array.

For the reasons stated above, and for other reasons stated below which will become apparent to those skilled in the art upon reading and understanding the present specification, there is a need in the art for alternative circuits and methods of programming NAND architecture Flash memory arrays.

SUMMARY

The above-mentioned problems with programming NAND architecture Flash memories and other problems are addressed by the present invention and will be understood by reading and studying the following specification.

The various embodiments relate to programming floating gate memory cells in NAND architecture Flash memories and/or memory arrays by utilizing a "boosted tub" programming approach. Memory device embodiments of the present invention utilize the boosted tub programming method to apply a voltage to the substrate or substrate "tub" (an isolation area in the integrated circuit, typically a positively doped region encased in a deep negatively doped well in the positively doped substrate, or a silicon on insulator(SOI)) of a NAND Flash memory array to precharge a channel of carriers within the floating gate memory cells prior to applying a high voltage to the gate of the selected floating gate memory cells and a program or program-inhibit voltage on a connected bitline as desired to program them. The use of a boosted tub programming approach avoids the requirement that the bitline and/or source line circuit design of the NAND Flash array be able to withstand or carry high voltages during programming of a floating gate memory cells and allows reuse of the block erase high voltage circuits connected to the substrate tub. This allows the NAND Flash memory array to be designed with smaller circuit designs and/or smaller circuit feature elements. The boosted tub programming approach also allows generation of a precharge channel that is easily adjustable and of a more uniform nature.

For one embodiment, the invention provides a method of operating a non-volatile memory device comprising coupling a precharge voltage on a substrate tub of a NAND architecture memory array of a plurality of floating gate memory cells, wherein the plurality of floating gate memory cells are coupled in a plurality of strings, coupling a gate programming voltage to the gate of a selected floating gate memory cell of each string of a selected number of strings, and selectively coupling a program voltage or a program-inhibit voltage to a channel of each string of the selected number of strings.

In another embodiment, the invention provides a method of operating a non-volatile memory device comprising generating a channel of carriers in a selected plurality of floating gate memory cells of a memory array, where the memory cells are coupled in a plurality of strings by placing a precharge voltage on a substrate tub that is coupled to the memory array; and programming a selected floating gate memory cell of a selected number of strings by removing the precharge voltage from the substrate tub, placing a gate programming voltage on the control gate of the selected floating gate memory cell of the selected number of strings, and selectively placing a program voltage or a program-inhibit voltage on a bitline coupled to a channel of each string of the selected number of strings.

In yet another embodiment, the invention provides a memory device comprising a substrate tub, a floating gate memory cell in series with at least one additional floating gate memory cell formed in the substrate tub, a word line coupled to a gate of the floating gate memory cell, a bitline coupled to a drain of the floating gate memory cell, and a source line coupled to a source of the floating gate memory cell, wherein the memory device is adapted to precharge a channel in the floating gate memory cell with a precharge voltage on the substrate tub and program the floating gate memory cell with a floating gate programming voltage on the gate and a program voltage or a program-inhibit voltage that is selectively coupled to the drain.

In a further embodiment, the invention provides a NAND architecture floating gate memory cell string comprising a NAND architecture floating gate memory cell memory string formed on a substrate tub having a plurality of floating gate memory cells coupled source to drain in a serial string, wherein the substrate tub is adapted to apply a precharge voltage to precharge carriers in a channel of the floating gate memory cells of the string, and wherein the NAND architecture floating gate memory cell memory string is adapted to program a selected floating gate memory cell of the string by placing a gate programming voltage on the gate of the selected floating gate memory cell and a program voltage or a program-inhibit voltage coupled to the channel of floating gate memory cell memory string.

Further embodiments of the invention include methods and apparatus of varying scope.

BRIEF DESCRIPTION OF THE DRAWINGS

FIGS. 2A, 2B, and 2C are simplified block diagrams of series string(s) of floating gate memory cells of a NAND architecture Flash memory array in accordance with an embodiment of the present invention.

FIG. 5 is a waveform diagram detailing a boosted bitline programming operation of a NAND Flash memory device in accordance with an embodiment of the present invention.

DETAILED DESCRIPTION

Figure 1:
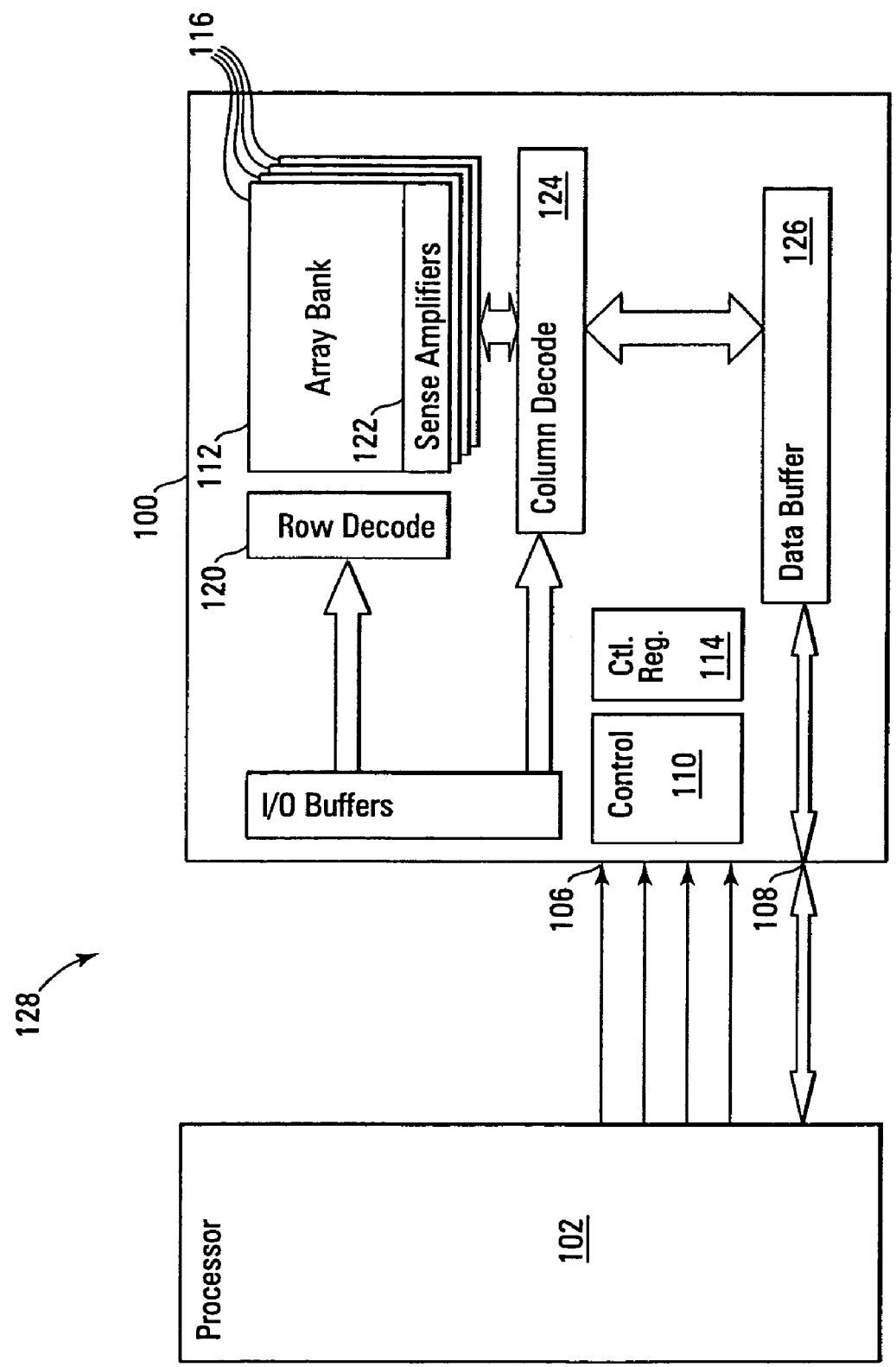
FIG. 1 is a simplified block diagram of a system containing a Flash memory device.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Embodiments of the present invention include devices that program floating gate memory cells in NAND architecture floating gate memory arrays utilizing boosted tub programming. Embodiments of the present invention also include Flash memory devices that utilize a boosted tub programming method to apply a voltage to the substrate or substrate tub of a NAND Flash memory array to precharge a channel of carriers within the floating gate memory cells prior to applying a high gate programming voltage to the gate of the selected floating gate memory cells and coupling a program or program-inhibit voltage to program the selected floating gate memory cells as desired. The use of a boosted tub programming approach avoids the requirement that the bitline and/or source line circuit design of the NAND Flash array be able to withstand or carry high voltages during programming of a floating gate memory cells and allows reuse of the block erase high voltage circuits connected to the substrate tub. This allows the NAND Flash memory array to be designed with smaller circuit designs and/or smaller circuit feature elements.

FIG. 1 shows a simplified diagram of a system 128 incorporating a Flash memory 100 embodiment of the present invention connected to a host 102, which is typically a processing device or memory controller. The Flash memory 100 has a control interface 106 and an address/data interface 108 that are each connected to the processing device 102 to allow memory read and write accesses. It is noted that in alternative embodiments, the address/data interface 108 can be divided into separate interfaces. Internal to the Flash memory device a control state machine 110 directs the internal operation; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116, each bank 116 is organized logically into a series of erase blocks (not shown). Memory access addresses are received on the address/data interface 108 of the Flash memory 100 and divided into a row and column address portions. On a read access the row address is latched and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

As stated above, a NAND array architecture arranges its array of floating gate memory cells in a matrix such that the gates of each floating gate memory cell of the array are connected by rows to word select lines. The memory cells of the array are arranged together in strings, typically of 8, 16, 32 or more each, where the memory cells connected together in series, source to drain, between a source line and a column bit line. The NAND architecture floating gate memory array is then accessed by a row decoder activating a row of floating gate memory cells by selecting the word select line connected to their gates. In addition, the word lines connected to the gates the unselected memory cells of each string are driven to operate the unselected memory cells of each string as pass transistors, so that they pass current in a manner that is unrestricted by their stored data values. Current then flows from the source line to the column bit line through each series connected string, restricted only by the memory cells selected to be read in each string. Thereby placing the current encoded stored data values of the row of selected memory cells on the column bit lines.

Figure 2A:
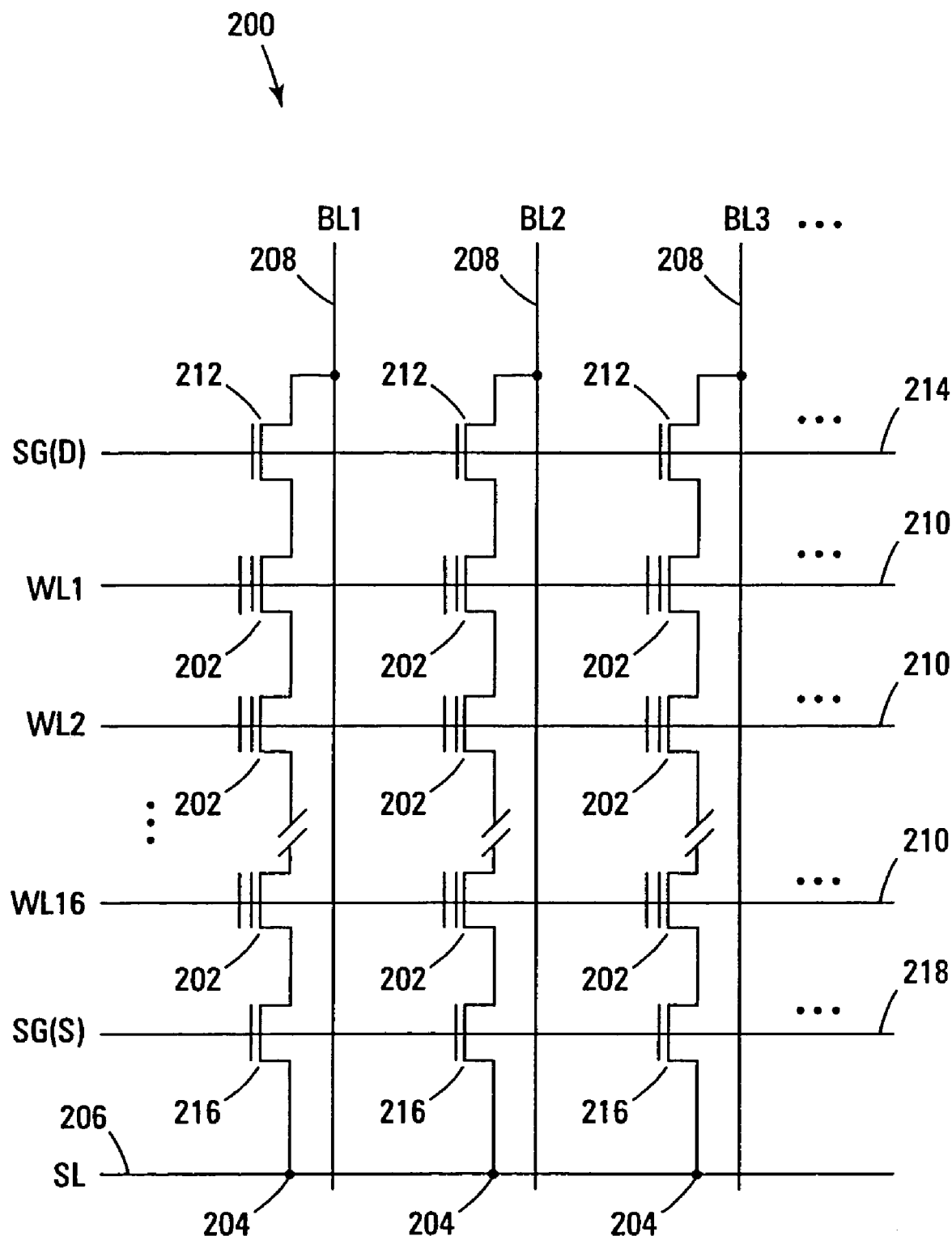

FIG. 2A shows a simplified diagram of a NAND Flash architecture floating gate memory array 200. In FIG. 2A, a NAND Flash array is comprised of a sequence of floating gate cell series strings 204. Each floating gate cell series string 204 contains 16 NMOS floating gate memory cells 202 that are connected drain to source in a series chain. Word lines (WL1–WL16) 210 that span across multiple series strings 204 are connected to the control gates of every floating gate cell 202 to control their operation. In operation, word lines 210 select the individual floating gate memory cell 202 in the series chain 204 to be written to or read from and operate the remaining floating gate memory cells 202 in each series string 204 in a pass through mode. Each series string 204 of floating gate memory cells 202 are connected to a source line 206 by a source select gate 216 and to an individual bitline (BL1–BLN) 208 by a drain select gate 212. The source select gates 216 are controlled by a source select gate control line (SG(S)) 218 connected to their control gates. The drain select gates 212 are controlled by a drain select gate control line (SG(D)) 214.

FIG. 2B shows a simplified schematic diagram of a NAND Flash architecture array 250 showing a floating gate memory string 204 and the coupling of its floating gate memory cells 202 to the substrate/substrate tub 252. In FIG. 2B, a NAND floating gate cell series string 204 contains NMOS floating gate memory cells 202 that are connected drain to source in a series chain. Word lines (WL1–WL3) 210 are connected to the control gates of the floating gate memory cells 202 to control their operation. In operation, the word lines 210 select the individual floating gate memory cell 202 in the series chain 204 to be written to or read from and operate the remaining floating gate memory cells 202 in the series string 204 in a pass through mode. The series string 204 is connected to a source line 206 by a source select gate 216 and to a bitline (BL0) 208 by a drain select gate 212. The source select gate 216 is controlled by a source select gate control line (SG(S)) 218 connected to the control gate. The drain select gate 212 is controlled by a drain select gate control line (SG(D)) 214. The control gate, floating gate, source, and drain are capacitively connected to the substrate tub 252. In addition, the source and drain are electrically and capacitively coupled by the intrinsic PN junction diode formed between the source and drain junctions (and any induced carrier channel) and the substrate/substrate tub 252. Typically, a NAND Flash memory array is formed in bank or erase block segments. In many cases the banks or segments are formed on one or more electrically isolated substrate tubs. For example, NMOS floating gate cell banks or segments can be separated by substrate tubs formed with P doped tubs isolated by a deep N wells in a P substrate. The substrate tubs allow for electrical isolation of the individual banks or erase blocks and enable individual bank or erase block segment operations, such as bulk erasure of the bank or erase block via the substrate tub and word lines.

Figure 2C:
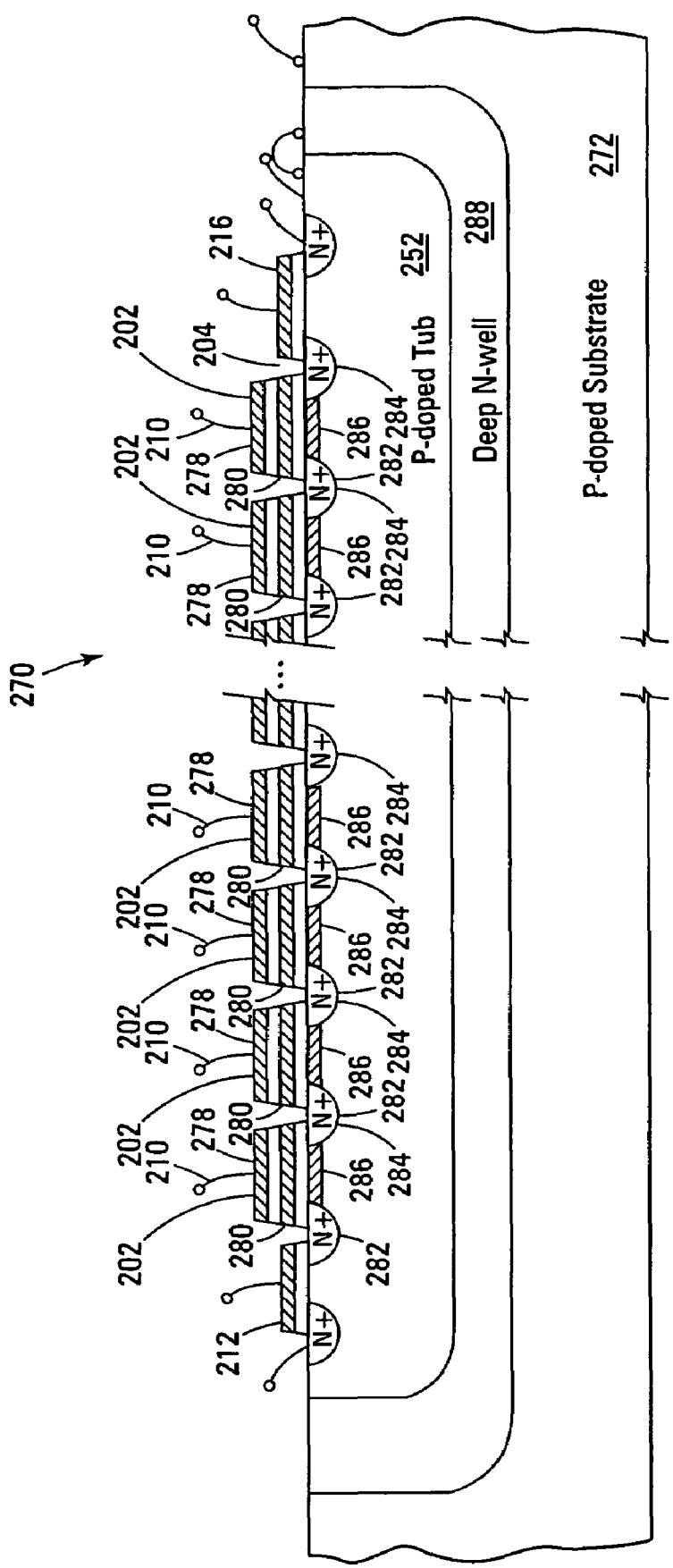

FIG. 2C shows a simplified diagram of a NAND Flash architecture array 270 showing a cross section of a series connected string 204 of physical floating gate transistor memory cells 202 and its relationship to the substrate 272, well 288, and the substrate tub 252. In FIG. 2C, NMOS floating gate transistor memory cells 202 are formed on a P doped substrate tub 252, which is in turn encased in a N-doped well 288 formed in a P-doped substrate 272. The NMOS floating gate transistor memory cells 202 each have a source well 284, a drain well 282, and a channel area 286 where minority carriers (electrons) selectively form to couple the source 284 and drain 282 regions of each NMOS floating gate transistor 202 when it is in operation. Each NMOS floating gate transistor memory cell 202 has a floating gate 278 and a control gate 278 formed over the source 284, drain 282, and channel area 286 and isolated by an insulator (typically silicon oxide).

It is noted that other forms of Flash NAND architecture memory arrays exist having differing configurations and differing numbers and types of memory cells, such as PMOS floating gate memory cells.

As stated above, in Flash memory programming in general the memory cells are programmed by applying a high voltage across the control gate and the source, drain, and/or channel of a selected floating gate transistor/memory cell to tunnel carriers into the electrically isolated "floating gate" within the memory cell. A floating gate memory cell in an erased state, with a lack of carriers in the floating gate (a lack of electrons), typically signifies a logic bit "1." A "programmed" floating gate memory cell state, with additional carriers on the floating gate, typically represents a logic bit "0." Generally, in programming a row of memory cells, the drain, source, and/or channel of the individual memory cells are supplied with either a "program" voltage or a "program-inhibit" voltage, as desired. A gate programming voltage is then established on the word line that is connected to and forms the control gates of the selected row of memory cells to program the individual floating gate memory cells of the row in either a programmed state or keep them in an erased state by inhibiting programming by the applied bitline voltage (logical "0" or a logical "1"). In other words, to change the state of the erased cell the voltage differential between the high gate programming voltage on the control gate of the selected memory cell and the program voltage applied to the connected bitline is enough to tunnel electrons into the floating gate of the selected memory cell and change it to a programmed state. Whereas, the voltage differential between the high gate programming voltage on the control gate of the selected memory cell and the program-inhibit voltage applied on the bitline is not enough to tunnel electrons into the floating gate of the selected memory cell and leaves it unchanged or "inhibited".

In a NAND architecture Flash memory, a boosted bitline programming process is accomplished by placing either a "program" voltage or a "program-inhibit" voltage, as is desired, on the bitlines connected to the series connected strings containing the floating gate memory cells to be programmed. The drain select gate is also turned on, allowing the voltage from the bitlines to be connected to "precharge" the channels of the serial strings. A high gate programming voltage is then established on the word line that is connected to the control gates of the selected row of memory cells. A high, but non-programming level voltage (a pass voltage) is established at the same time on the word lines of the remaining floating gate memory cells of the selected series connected strings. This high pass voltage has the effect of turning the remaining memory cells to an "on" condition regardless of the programmed state of their internal floating gate, allowing them to pass the "program" or "program-inhibit" voltage that was placed on the individually connected bitline to the selected memory cell of the individual series strings being programmed. The gate programming voltage on the selected row of memory cells then programs them to either a programmed state or keeps it unchanged in an inhibited state (logical "0" or a logical "1") dependent on the connected program/program-inhibit voltage placed on the connected bitlines.

Figure 3:
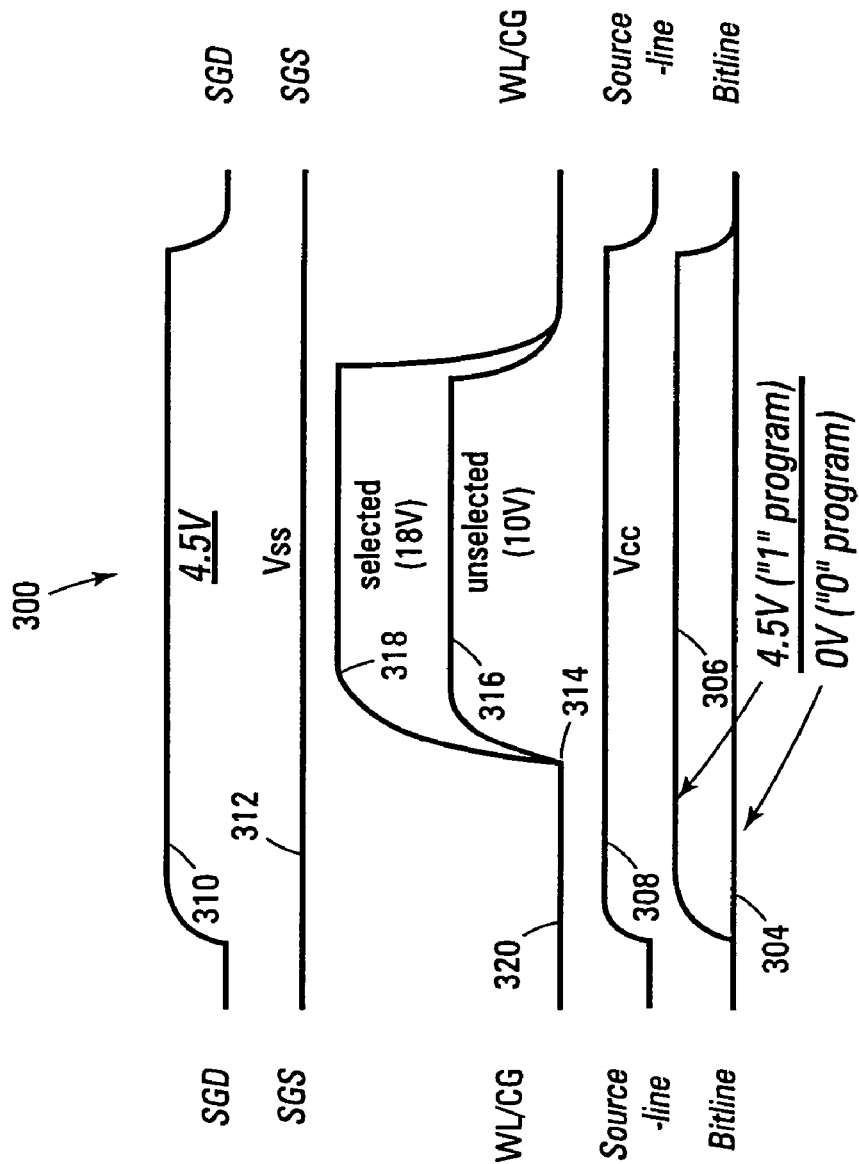
FIG. 3 is a waveform diagram detailing a boosted bitline programming operation of a NAND Flash memory device of the prior art.

FIG. 3 show waveforms 300 of a NAND Flash architecture floating gate memory string in a boosted bitline programming operation 300 of the prior art with program and program inhibit voltages. In FIG. 3, a program voltage of 0V (program logical 0) 304 or program-inhibit voltage of 4.5V (program logical 1) 306 is placed on the bitline 302, 208. A voltage of 4.5V 310 is applied to the gate of the drain select gate 212 on the drain select gate control line 214, enabling it and precharging the voltage on the bitline 302,208 (either 4.5V program-inhibit voltage 306 or 0V program voltage 304) to the serial string of floating gate-memory cells 204. A voltage of Vss 312 is applied to the gate of the source select gate 216 on the source select gate control line 218, keeping it turned off and isolating the source line 206 (which has been brought to a voltage of Vcc 308) from the serial string of memory cells 204. After a selected time period 314, a high gate programming voltage of 18V 318 is applied to the control gate of the selected floating gate cell 202 on its word line 320, 210, while a pass voltage of 10V 316 is applied to the control gates of the unselected floating gate memory cells 202 of the serial string 204. The voltage differential between the 18V gate programming voltage 318 on the control gate of the selected memory cell 202 and the 0V program voltage 304/4.5V program-inhibit voltage 306 of the bitline 302, 208 programs/program-inhibits the floating gate of the selected memory cell 202. In programming, 4.5V bitline voltage precharges carriers in the channel of the serial string of floating gate memory cells 204 and then as the 18V gate programming voltage 318 is applied on the control gate of the selected memory cell 202 turning off the drain select gate 212 and trapping the charge in the channel. The trapped charge is capacitively coupled upwards by the 18V gate programming voltage 318 on the control gate of the selected memory cell 202 decreasing the programming voltage differential between the carriers of the channel and the 18V gate programming voltage 318. A 0V bitline voltage allows the drain select gate 212 to remain in an on state, connecting the channel of the serial string of floating gate memory cells 204 to the 0V applied to the bitline. This clamps the channel to 0V to maintain the programming voltage differential between the channel of the serial string of floating gate memory cells 204 and the 18V gate programming voltage 318 to tunnel carriers into the isolated floating gate.

In a NAND architecture Flash memory, another approach is the boosted source line programming process, accomplished by placing precharge voltage on the source line connected to the serial strings. The source control gates are also turned on to connect the voltage to the serial strings. Additionally, a "program" voltage or a "program-inhibit" voltage, as is desired, is established on the bitlines connected to the series connected strings containing the floating gate memory cells to be programmed, but is not connected to the selected serial strings. While the precharge voltage is available on the connected source line, a high gate programming voltage is established on the word lines the selected floating gate memory cells and a high pass voltage is established on the word lines of the non-selected floating gate memory cells of the series connected strings. This turns on the floating gate transistor memory cells of the strings and establishes/precharges a channel of carriers in them (typically electrons in NMOS floating gate transistors). Once the channel has been precharged in the selected serial strings, the source control gates are turned off, unconnecting the precharge voltage from the serial strings. The drain select gates are then turned on, allowing the program voltage or program-inhibit voltage to be connected to the selected series connected strings from the bitlines. The gate programming voltage on the selected memory cells then programs them to either a programmed state or an inhibited state (logical "0" or a logical "1") dependent on the connected program/program-inhibit voltage placed on the connected bitlines.

Figure 4:
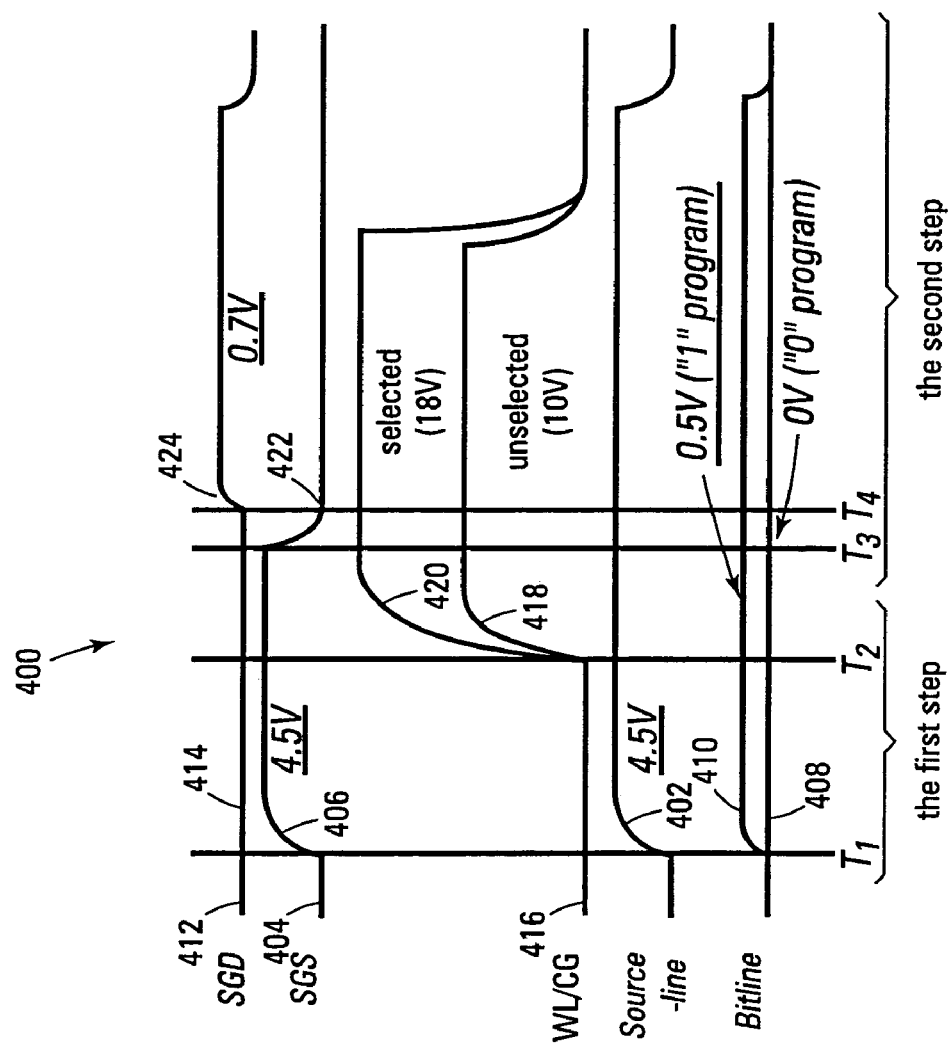
FIG. 4 is a waveform diagram detailing a boosted source line programming operation of a NAND Flash memory device of the prior art.

FIG. 4 shows waveforms 400 of a NAND Flash architecture floating gate memory string in a boosted source line programming operation of the prior art with program and program inhibit voltages. In FIG. 4, the NAND architecture floating gate series string 204 is precharged by a 4.5V voltage 402 on the source line 206 that is connected to the serial strings 204 through the source control gates 216 which are turned on by a 4.5V voltage 406 placed on source select gate control line 404, 218. At the same time, a "program" voltage of 0V 408 or a "program-inhibit" voltage of 0.5V 410, as is desired, is established on the bitlines 208 connected to the series connected strings 204 containing the floating gate memory cells 202 to be programmed. The program 408 or program-inhibit 410 voltages, however, are isolated from the selected serial strings 204 by the drain control gates 216, which are turned off by 0V 414 that is placed on the drain select gate control line 412,214. While the precharge voltage of 4.5V 402 is available on the connected source line 206, a high gate programming voltage of 18V 420 is established on the word lines 416, 210 of the selected floating gate memory cells 202 and a high pass voltage 418 is established on the word lines 416, 210 of the non-selected floating gate memory cells 202 of the series connected strings 204. This turns on the NMOS floating gate transistor memory cells 202 of the strings 204 and establishes/precharges a channel of electrons in them. Once the channel has been precharged in the selected serial strings 204, the source control gates 216 are turned off by placing 0V 422 on the source select gate control line 404, 218, unconnecting the precharge voltage of 4.5V 402 of the source line 206 from the serial strings 204. A near threshold voltage of 0.7V 424 (assuming a 0.6V threshold drain select gate transistor) is then applied to the drain select gate control line 412, 214. If the applied bitline 208 voltage is the program voltage of 0V the drain select gate 212 turns on and clamps the channel of the serial string of floating gate memory cells 204 to 0V 408. Alternatively, if the applied bitline voltage is the program-inhibit voltage of 0.5V 410 the drain select gate 212 remains off and the carrier charge in the channel stays trapped and is capacitively coupled upwards by the applied gate programming voltage 420, 418. The high gate programming voltage of 18V 420 on the selected memory cells 202 programs the memory cells 202 to either a programmed state or an inhibited state (logical "0" or a logical "1") dependent on the connected program 408/program-inhibit 410 voltage placed on the bitlines 208.

It is noted that other programming voltage levels, sequences, and optimizations are possible for the boosted bitline and boosted source line NAND architecture Flash programming methods.

Embodiments of the present invention utilize boosted substrate tub or boosted substrate programming (referred to herein as boosted tub programming) to precharge the channel of the selected serial strings of floating gate memory cells and program the selected memory cells with a gate programming voltage connected to the gates of the selected memory cells with which to tunnel carriers. In boosted tub programming, the substrate or substrate "tub" (referred to herein as the "tub") is raised to an elevated voltage level to stably and uniformly precharge the channels and source and drain nodes of the floating gate transistor memory cells of each serial string with carriers. The carriers are coupled to the channels of the serial strings through the intrinsic diode formed between the source, drain, and channel of each floating gate transistor memory cell and the substrate tub. A high pass voltage is then applied to the gates of the non-selected floating gate memory cells and a high gate programming voltage to the selected memory cells, allowing the selected memory cells to be programmed in correspondence to a program or program-inhibit voltage placed on the bitlines.

This precharging of the channels with the substrate tub in boosted tub programming allows for lower voltages to be utilized with the bitline circuits, source line circuits, decoders, and sense amplifiers/drivers of the floating gate memory array. The lower operating voltages of these circuits allow for smaller circuits and device feature sizes to be used in these devices, which in turn allows for a smaller Flash/floating gate memory array to be designed. Boosted tub programming also allows for reuse of the high voltage circuits in the substrate/substrate tub that are utilized for bulk erasure of the erase blocks of the NAND Flash architecture floating gate memory array. Additionally, boosted tub programming allows for more specific control of the precharge voltage than in a boosted bitline or boosted source line programming methods, with their more complex circuit paths and multiple intervening circuit nodes. Because of this reduced intervening circuit complexity, the tub voltage can also be more easily and more uniformly optimized for programming and minimum disturb. The boosted tub programming approach also establishes a more uniform and stable channel in the strings of floating gate memory cells regardless of their individual programmed states allowing for better control and precision in the programming operation.

In programming a NAND architecture Flash memory with a boosted tub programming approach, the substrate tub 252 is raised to a selected precharge voltage level. At the same time a similar level voltage is placed on the bitlines 208 and source line 206 connected to the selected serial strings of floating gate memory cells 204. Alternatively, the bitlines 208 and source line 206 can be placed in high impedance mode (Hi Z) and allowed to float up with the elevated voltage of the substrate tub 252 instead of being driven with a separate voltage. The selected precharge voltage applied to the substrate tub 252 flows through the intrinsic diodes (not shown) formed in each floating gate transistor 202 by the junction of the source and drain N+ diffusions and the P doped substrate tub 252. The voltage seen at each floating gate transistor 202 (the substrate tub 252 precharge voltage, less a diode drop) precharges a channel of carriers in the floating gate transistor 202. A portion of this channel voltage will remain (the precharge voltage less a diode drop will be affected by capacitive coupling and so will be reduced by the coupling ratio of the channel to the total capacitance due to the intrinsic diode depletion region, control gate, and source and drain nodes) after the precharge voltage is removed from the substrate tub 252 because of the intrinsic diodes.

After the channels of the floating gate transistor memory cells of the serial strings are precharged, the applied voltage on the substrate tub 252 is lowered. At the same time, a high gate programming voltage is established on the word line 210 of the selected floating gate memory cells 202 and a high pass voltage is established on the word lines 210 of the non-selected floating gate memory cells 202 of the series connected strings 204. Additionally, "program" voltage or a "program-inhibit" voltage, as is desired, is established on the bitlines 208 connected to the series connected strings 204 containing the floating gate memory cells 202 to be programmed. A "program" bitline voltage turns on the drain select gate 212, discharging the precharged channel of the selected series connected strings 204 and allowing the selected floating gate memory cells 202 to be programmed. A "program-inhibit" bitline voltage places the drain select gate 212 in an off state and traps the precharged carriers in the channel of the selected serial string of floating gate memory cells 204 allowing them to capacitively couple upwards in voltage and prevent programming of the floating gate memory cells 202 of the selected serial string 204. The gate programming voltage on the selected memory cells 202 then programs the selected floating gate memory cells 202 of the serial string 204 to either a programmed state or an inhibited state (logical "0" or a logical "1"), dependent on the program or program-inhibit voltage placed on the connected bitlines 208.

FIG. 5 shows waveforms 500 of a NAND Flash architecture floating gate memory array in a boosted tub programming operation with program and program inhibit voltages. In FIG. 5, the NAND architecture floating gate cell 202 series strings 204 are precharged through their source/drain well intrinsic diodes by a 5V voltage 502 on the substrate tub 252. At the same time, the bitlines 208 and source line 206 connected to the selected serial strings 204 of floating gate memory cells 202 are placed into a high impedance mode and allowed to follow the P+ substrate tub 252 precharge voltage, less a diode drop, to approximately 4.5V 504, 506. Alternatively, a voltage of 4.5V 504, 506 can be placed on the bitlines 208 and source line 206 connected to the selected serial strings 204 of floating gate memory cells 202. The floating or low voltage bitlines 208 and source line 206 that are not driven or are minimally driven allow for the use of low voltage circuit devices with smaller device feature sizes in the bitline and source line circuitry, decode circuitry, and any supporting circuitry.

As shown in FIG. 5, in the boosted tub programming operation, the drain select gates 212 are turned on by a 1V voltage 508 applied to the drain select gate control line 214, allowing the bitline voltage 504 to be connected to the selected series connected strings 204 from the bitlines 208. The source select gates 216 are turned off by a 0V voltage 512 applied to the source select gate control line 218, isolating the 4.5V voltage 506 of the source line 206 from the selected series connected strings 204. Alternatively, to decrease the possibility of punch through damage of the source select gates 216, the source select gates 216 are turned on by a 1V voltage 510 applied to the source select gate control line 218, allowing the 4.5V voltage 506 to be connected to the selected series connected strings 204 from the source line 206. The word lines 210 of the floating gate memory cells 202 of the series connected strings 204 are kept at 0V 522 or placed in a high impedance mode and allowed to float 520. The 5V precharge voltage 502 applied to the substrate tub 252 flows through the intrinsic diodes (not shown) formed in each floating gate transistor 202 between the channel, source well, and drain well and the substrate tub 252. The voltage seen at each floating gate transistor 202 (the substrate tub 252 precharge voltage less a diode drop) precharges a channel of carriers in the floating gate transistor 202. It is noted that the intrinsic diodes of the channel, source, and drain allow the precharge voltage and generated carrier channel to be retained in the channel after the precharge voltage is removed.

As the substrate tub 252 precharge voltage of 5V 502 is lowered and the substrate tub 252 discharges 514, a high gate programming voltage of 20V 516 is applied on the word lines 210 of the selected floating gate memory cells 202 and a high pass voltage of 10V 518 is applied on the word lines 210 of the non-selected floating gate memory cells 202 of the series connected strings 204, turning them on. After, or at the same time, the desired "program" voltage of 0V 526 or "program-inhibit" voltage of Vcc 524 is established on the bitlines 208 connected to the series connected strings 204. The voltage placed on the connected bitlines 208 in combination with the gate programming voltage of 20V 516 traps the precharged carriers in the channel of the selected serial strings 204 or discharges them and thus programs the selected floating gate memory cells 202 to either a programmed state or an inhibited state (logical "0" or a logical "1").

It is noted that in the NAND architecture Flash memory device embodiment of the present invention shown in FIG. 5, the boosted tub 5V voltage 502 is removed slightly after the high select 10V word line voltage 518 and the gate programming 20V word line voltage 516 are applied, such that word line voltages have already reached approximately 5V or 6V. This allows for better coupling of the precharged channel to the programming voltages. However, it is noted that the relative timing of the word line voltages 516, 518, the substrate tub voltage 502, and the bitline voltages 524, 526 in other embodiments of the present invention may vary allowing for differing optimization of the precharge values and inhibit characteristics.

It is also noted that other programming voltage levels and sequences are possible and should be apparent for boosted substrate/substrate tub NAND architecture Flash programming method and array embodiments of the present invention for those skilled in the art with the benefit of this disclosure.

CONCLUSION

A boosted substrate tub/substrate floating gate memory cell programming process has been described that applies a voltage to the substrate or substrate "tub" of a NAND Flash memory array to precharge a channel of carriers within the floating gate memory cells prior to applying a high gate programming voltage to the gate of the selected floating gate memory cells and coupling a program or program-inhibit voltage to program the selected floating gate memory cell(s) as desired. The use of a boosted tub programming approach avoids the requirement that the bitline and/or source line circuit design of the NAND Flash array be able to withstand or carry high voltages during programming of a floating gate memory cells and allows reuse of the block erase high voltage circuits connected to the substrate tub. This allows the NAND Flash memory array to be designed with smaller circuit designs and/or smaller circuit feature elements. The boosted tub programming approach also allows generation of a precharge channel that is easily adjustable and of a more uniform nature.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
   a substrate tub;
   a floating gate memory cell in series with at least one additional floating gate memory cell formed in the substrate tub;
   a word line coupled to a gate of the floating gate memory cell;
   a bitline coupled to a drain of the floating gate memory cell; and
   a source line coupled to a source of the floating gate memory cell, wherein the memory device is adapted to precharge a channel in the floating gate memory cell with a precharge voltage on the substrate tub and program the floating gate memory cell with a floating gate programming voltage on the gate and a program voltage or a program-inhibit voltage that is selectively coupled to the drain.

2. The memory device of claim 1, wherein the floating gate memory cell is one of a plurality of floating gate memory cells arranged in a memory array, where the plurality of memory cells are coupled into a plurality of strings of memory cells with the floating gate memory cells in each string serially coupled source to drain, where a drain of a first floating gate memory cell of each string is coupled to the bitline and a source of a final floating gate memory cell of each string is coupled to the source line.

3. The memory device of claim 2, wherein the drain of the first floating gate memory cell of each string of floating gate memory cells is coupled to a drain select gate transistor and the source of the final floating gate memory cell is coupled to a source select gate transistor.

4. The memory device of claim 2, wherein the memory device is adapted to precharge a channel in a selected string of the floating gate memory cells with the precharge voltage on the substrate tub and to program a selected floating gate memory cell of the string with the gate programming voltage on the gate of the selected floating gate memory cell and a program voltage or a program-inhibit voltage that is selectively coupled to the drain of the first floating gate memory cell of the selected string.

5. The memory device of claim 2, wherein the memory device is adapted to couple a pass voltage to the unselected floating gate memory cells of a selected string of floating gate memory cells.

6. The memory device of claim 1, wherein the memory device is adapted to remove the precharge voltage of the substrate tub before programming the floating gate memory cell by asserting the gate programming voltage on the gate and the program voltage or the program-inhibit voltage to the drain.

7. The memory device of claim 1, wherein the memory device is adapted to remove the precharge voltage of the substrate tub after asserting the gate programming voltage on the gate and the program voltage or the program-inhibit voltage to the drain to program the floating gate memory cell.

8. The memory device of claim 7, wherein the memory device is adapted to remove the precharge voltage of the substrate tub after the gate programming voltage has been asserted on the gate and reached a selected voltage level.

9. The memory device of claim 1, wherein the memory device is a non-volatile memory device.

10. A Flash memory device comprising:
    a NAND architecture memory array formed on at least one substrate tub having a plurality of floating gate memory cells arranged in rows and columns and coupled into a plurality of strings;
    a plurality of word lines, wherein each word line is coupled to one or more gates of a row of the floating gate memory cells;
    a plurality of bitlines, wherein each bitline is coupled to a drain of a first floating gate memory cell of one or more strings;
    at least one source line, wherein the at least one source line is coupled to a source of a last floating gate memory cell of one or more strings;
    wherein the Flash memory device is adapted to couple a precharge voltage on the at least one substrate tub to precharge a channel in the plurality of strings of floating gate memory cells; and
    wherein the Flash memory device is adapted to program a selected floating gate memory cell of each of a selected number of strings of floating gate memory cells by applying a gate programming voltage to the gate of the selected floating gate memory cell through the coupled word line and by applying a selected program voltage or a program-inhibit voltage through the coupled bitline.

11. The Flash memory device of claim 10, wherein the Flash memory device is adapted to remove the coupled precharge voltage of the substrate tub before programming the selected floating gate memory cell of each of a selected number of strings of floating gate memory cells by applying a gate programming voltage to the gate of the selected floating gate memory cell through the coupled word line and by applying a selected program voltage or a program-inhibit voltage through the coupled bitline.

12. The Flash memory device of claim 10, wherein the Flash memory device is adapted to remove the coupled precharge voltage of the substrate tub after applying the gate programming voltage to the gate of the selected floating gate memory cell.

13. The Flash memory device of claim 12, wherein the Flash memory device is adapted to remove the precharge voltage of the substrate tub after the gate programming voltage has been applied to the gate of the selected floating gate memory cell and has reached a predetermined voltage level.

14. The Flash memory device of claim 10, wherein the Flash memory device is adapted to selectively adjust the precharge voltage of the substrate tub.

15. The Flash memory device of claim 10, wherein the Flash memory device is adapted to selectively adjust the precharge voltage of the substrate tub to alter programming disturb characteristics of the floating gate memory cells of the array.

16. The Flash memory device of claim 10, wherein the substrate tub is a P doped well area.

17. The Flash memory device of claim 10, wherein the substrate tub is a silicon on insulator (SOI) area.

18. The Flash memory device of claim 10, wherein the Flash memory device is adapted to place the plurality of word lines in a high impedance state while the precharge voltage is applied to the substrate tub.

19. The Flash memory device of claim 10, wherein the Flash memory device is adapted to drive the plurality of word lines with a selected voltage while the precharge voltage is applied to the substrate tub.

20. The Flash memory device of claim 10, wherein the Flash memory device is adapted to place the plurality of bitlines in a high impedance state while the precharge voltage is applied to the substrate tub.

21. The Flash memory device of claim 10, wherein the Flash memory device is adapted to drive the plurality of bitlines with a selected voltage while the precharge voltage is applied to the substrate tub.

22. The Flash memory device of claim 10, wherein the Flash memory device is adapted to place the one or more source lines in a high impedance state while the precharge voltage is applied to the substrate tub.

23. The Flash memory device of claim 10, wherein the Flash memory device is adapted to drive the one or more source lines with a selected voltage while the precharge voltage is applied to the substrate tub.

24. A NAND architecture floating gate memory cell string comprising:
 a NAND architecture floating gate memory cell memory string formed on a substrate tub having a plurality of floating gate memory cells coupled source to drain in a serial string;
 wherein the substrate tub is adapted to apply a precharge voltage to precharge carriers in a channel of the floating gate memory cells of the string; and
 wherein the NAND architecture floating gate memory cell memory string is adapted to program a selected floating gate memory cell of the string by placing a gate programming voltage on the gate of the selected floating gate memory cell and a program voltage or a program-inhibit coupled to the channel of floating gate memory cell memory string.

25. The NAND architecture floating gate memory cell string of claim 24, further comprising:
 a plurality of word lines, wherein each word line is coupled to a gate of a floating gate memory cell of the string;
 a plurality of bitlines, wherein each bitline is coupled to a drain of a first floating gate memory cell of the string; and
 at least one source line, wherein the at least one source line is coupled to a source of a last memory cell of the string.

26. The NAND architecture floating gate memory cell string of claim 24, wherein the NAND architecture floating gate memory cell memory string is adapted to couple a program-inhibit voltage to the channel of floating gate memory cell memory string.

27. The NAND architecture floating gate memory cell string of claim 24, wherein the floating gate memory cells are NMOS floating gate transistors.

28. The NAND architecture floating gate memory cell string of claim 24, wherein the floating gate memory cells are PMOS floating gate transistors.

29. The NAND architecture floating gate memory cell string of claim 24, wherein the NAND architecture floating gate memory cell memory string is adapted to actively discharge the substrate tub after removing the applied precharge voltage.

30. A NAND architecture Flash memory device comprising:
 a NAND architecture memory array formed on a substrate tub having a plurality of floating gate memory cells arranged in rows and columns in a plurality of erase blocks, wherein the plurality of floating gate memory cells are serially coupled source to drain into a plurality of serial strings;
 a control circuit;
 a row decoder coupled to a plurality of word lines, wherein each word line is coupled to one or more gates of a row of the floating gate memory cells;
 a plurality of bitlines, wherein each bitline is coupled to a first floating gate memory cell of one or more strings through a drain control gate transistor;
 at least one source line, wherein the at least one source line is coupled to a last memory cell of one or more strings through a source control gate transistor;
 wherein the control circuit is adapted to couple a precharge voltage to the substrate tub to precharge a channel of carriers in the plurality of strings of floating gate memory cells; and
 wherein NAND architecture Flash memory device is adapted to program a selected floating gate memory cell of each of a selected number of strings of floating gate memory cells by placing a gate programming voltage on the gate of the selected floating gate memory cell through the coupled word line and by placing a selected program voltage or a program-inhibit voltage on the coupled bitline while a high pass voltage is placed on the gates of the non-selected floating gate memory cells.

31. The NAND architecture floating gate memory device of claim 30, wherein the NAND architecture Flash memory device is adapted to turn on the drain control gate transistor during programming the selected floating gate memory cell and couples the selected program voltage or program-inhibit voltage that is placed on the coupled bitline.

32. The NAND architecture floating gate memory device of claim 30, wherein the NAND architecture Flash memory device is adapted to turn on the source control gate transistor when the precharge and programming voltages are applied to the selected number of strings.

33. The NAND architecture floating gate memory device of claim 30, wherein the NAND architecture Flash memory device is adapted to turn off the source control gate transistor when the precharge and programming voltages are applied to the selected number of strings.

34. A system comprising:
a host coupled to a Flash memory device, wherein the Flash memory device comprises,
a NAND architecture memory array formed on at least one substrate tub having a plurality of floating gate memory cells arranged in rows and columns and coupled into a plurality of strings;
a plurality of word lines, wherein each word line is coupled to one or more gates of a row of the floating gate memory cells;
a plurality of bitlines, wherein each bitline is coupled to a drain of a first floating gate memory cell of one or more strings;
at least one source line, wherein the at least one source line is coupled to a source of a last floating gate memory cell of one or more strings;
wherein the Flash memory device is adapted to couple a precharge voltage on the at least one substrate tub to precharge a channel in the plurality of strings of floating gate memory cells; and
wherein the Flash memory device is adapted to program a selected floating gate memory cell of each of a selected number of strings of floating gate memory cells by applying a gate programming voltage to the gate of the selected floating gate memory cell through the coupled word line and by applying a selected program voltage or a program-inhibit voltage through the coupled bitline.

35. The system of claim 34, wherein the host is a processor.

36. The system of claim 34, wherein the host is a computer system.

37. A Flash memory device comprising:
a NAND architecture memory array formed on a substrate tub having a plurality of floating gate memory cells arranged in rows and columns and coupled into a plurality of strings;
a plurality of word lines, wherein each word line is coupled to one or more gates of a row of the floating gate memory cells;
a plurality of bitlines, wherein each bitline is coupled to a drain of a first floating gate memory cell of one or more strings;
at least one source line, wherein the at least one source line is coupled to a source of a last floating gate memory cell of one or more strings;
a means for applying a precharge voltage on the substrate tub;
a means for programming a selected floating gate memory cell of each of a selected number of strings of floating gate memory cells; and
a means for program-inhibiting a selected floating gate memory cell of each of a selected number of strings of floating gate memory cells.

38. A memory array comprising:
a substrate;
a floating gate memory cell formed in the substrate tub;
a word line coupled to a gate of the floating gate memory cell;
a bitline coupled to a drain of the floating gate memory cell; and
a source line coupled to a source of the floating gate memory cell, wherein the memory array is adapted to precharge a channel in the floating gate memory cell with a precharge voltage on the substrate and program the floating gate memory cell with a floating gate programming voltage on the gate and a program voltage or a program-inhibit voltage that is selectively coupled to the drain.

39. The memory array of claim 38, wherein the substrate further comprises a substrate tub formed in a substrate.

40. The memory array of claim 38, wherein the floating gate memory cell is one of a plurality of floating gate memory cells arranged in rows and columns.

41. The memory array of claim 40, wherein the plurality of memory cells are coupled into a plurality of strings of memory cells with the floating gate memory cells in each string serially coupled source to drain, where a drain of a first floating gate memory cell of each string is coupled to the bitline and a source of a final floating gate memory cell of each string is coupled to the source line.

42. The memory array of claim 41, wherein the drain of the first floating gate memory cell of each string of floating gate memory cells is coupled to a drain select gate transistor and the source of the final floating gate memory cell is coupled to a source select gate transistor.

43. The memory array of claim 41, wherein the memory array is adapted to precharge a channel in a selected string of the floating gate memory cells with the precharge voltage on the substrate and to program a selected floating gate memory cell of the string with the gate programming voltage on the gate of the selected floating gate memory cell and a program voltage or a program-inhibit voltage that is selectively coupled to the drain of the first floating gate memory cell of the selected string.

44. The memory array of claim 41, wherein the memory array is adapted to couple a pass voltage to the unselected floating gate memory cells of a selected string of floating gate memory cells.

45. The memory array of claim 38, wherein the memory array is adapted to remove the precharge voltage of the substrate before programming the floating gate memory cell by asserting the gate programming voltage on the gate and the program voltage or the program-inhibit voltage to the drain.

46. The memory array of claim 38, wherein the memory array is adapted to remove the precharge voltage of the substrate after asserting the gate programming voltage on the gate and the program voltage or the program-inhibit voltage to the drain to program the floating gate memory cell.

47. The memory array of claim 46, wherein the memory array is adapted to remove the precharge voltage of the substrate after the gate programming voltage has been asserted on the gate and reached a selected voltage level.

48. A NAND memory array, comprising:
a plurality of floating gate memory cells arranged in rows and columns and coupled into a plurality of strings formed on a substrate;
a plurality of word lines, wherein each word line is coupled to one or more gates of a row of the floating gate memory cells;
a plurality of bitlines, wherein each bitline is coupled to a drain of a first floating gate memory cell of one or more strings;
at least one source line, wherein the at least one source line is coupled to a source of a last floating gate memory cell of one or more strings;
wherein the NAND memory array is adapted to couple a precharge voltage on the substrate to precharge a channel in the plurality of strings of floating gate memory cells; and wherein the NAND memory array is adapted to program a selected floating gate memory cell of each of a selected number of strings of floating gate memory cells by applying a gate programming voltage to the gate of the selected floating gate memory cell through the coupled word line and by applying a selected program voltage or a program-inhibit voltage through the coupled bitline.

49. The NAND memory array of claim 48, wherein the substrate further comprises a substrate tub formed in a substrate.

50. The NAND memory array of claim 48, wherein the NAND memory array is adapted to remove the coupled precharge voltage of the substrate before programming the selected floating gate memory cell of each of a selected number of strings of floating gate memory cells by applying a gate programming voltage to the gate of the selected floating gate memory cell through the coupled word line and by applying a selected program voltage or a program-inhibit voltage through the coupled bitline.

51. The NAND memory array of claim 48, wherein the NAND memory array is adapted to remove the coupled precharge voltage of the substrate after applying the gate programming voltage to the gate of the selected floating gate memory cell.

52. The NAND memory array of claim 51, wherein the NAND memory array is adapted to remove the precharge voltage of the substrate after the gate programming voltage has been applied to the gate of the selected floating gate memory cell and has reached a predetermined voltage level.

53. The NAND memory array of claim 48, wherein the NAND memory array is adapted to selectively adjust the precharge voltage of the substrate.

* * * * *